(12) United States Patent
Iwai et al.

(10) Patent No.: US 11,594,289 B2
(45) Date of Patent: Feb. 28, 2023

(54) SEMICONDUCTOR DEVICE, MEMORY SYSTEM AND SEMICONDUCTOR MEMORY DEVICE

(71) Applicant: Kioxia Corporation, Tokyo (JP)

(72) Inventors: Katsuhiko Iwai, Yokohama Kanagawa (JP); Shinji Maeda, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/409,116

(22) Filed: Aug. 23, 2021

(65) Prior Publication Data

US 2022/0301642 A1  Sep. 22, 2022

(30) Foreign Application Priority Data

Mar. 22, 2021  (JP) .............................. JP2021-047719

(51) Int. Cl.
| | |
|---|---|
| *G11C 16/34* | (2006.01) |
| *G11C 16/04* | (2006.01) |
| *G11C 16/08* | (2006.01) |
| *G11C 16/28* | (2006.01) |
| *G11C 16/30* | (2006.01) |

(52) U.S. Cl.
CPC ...... *G11C 16/3431* (2013.01); *G11C 16/0433* (2013.01); *G11C 16/08* (2013.01); *G11C 16/28* (2013.01); *G11C 16/30* (2013.01); *G11C 16/3404* (2013.01)

(58) Field of Classification Search
CPC . G11C 16/3431; G11C 16/0433; G11C 16/08; G11C 16/28; G11C 16/30; G11C 16/3404
See application file for complete search history.

(56) References Cited

U.S. PATENT DOCUMENTS

| | | |
|---|---|---|
| 6,504,744 B2 | 1/2003 | Aritomi et al. |
| 7,697,355 B2 | 4/2010 | Kobayashi |
| 9,646,709 B2 | 5/2017 | Reusswig et al. |
| 2009/0073763 A1 | 3/2009 | Hosono |
| 2017/0076811 A1* | 3/2017 | Reusswig .............. G11C 29/52 |
| 2017/0221570 A1* | 8/2017 | Hong ................ G11C 16/3418 |

FOREIGN PATENT DOCUMENTS

| | | |
|---|---|---|
| JP | 2001-351399 A | 12/2001 |
| JP | 4510060 B2 | 7/2010 |
| JP | 4952137 B2 | 6/2012 |

* cited by examiner

*Primary Examiner* — Tri M Hoang
(74) *Attorney, Agent, or Firm* — Foley & Lardner LLP

(57) ABSTRACT

A semiconductor device includes a transmission and reception circuit and a control circuit. The transmission and reception circuit transmits and receives a signal to and from a semiconductor memory device. The control circuit acquires threshold voltage distribution information of a memory element connected to a word line for read disturb detection to which a second voltage higher than a first voltage applied to an adjacent word line adjacent to a read target word line during a read operation is applied and determines an influence of read disturb based on the threshold voltage distribution information.

16 Claims, 12 Drawing Sheets

SEMICONDUCTOR DEVICE, MEMORY SYSTEM AND SEMICONDUCTOR MEMORY DEVICE

CROSS-REFERENCE TO RELATED APPLICATION

This application is based upon and claims the benefit of priority from Japanese Patent Application No. 2021-047719, filed Mar. 22, 2021, the entire contents of which are incorporated herein by reference.

FIELD

Embodiments described herein relate generally to a semiconductor device, a memory system, and a semiconductor memory device.

BACKGROUND

In a nonvolatile memory, a phenomenon called read disturb occurs in which a memory cell stores an unintended charge by repeating a read operation and a voltage of a word line in the same block rises. If detection of the influence of read disturb is delayed, data restoration fails or processing time for data restoration increases.

DETAILED DESCRIPTION

Embodiments provide a semiconductor device, a memory system, and a semiconductor memory device capable of detecting the influence of read disturb at an early stage.

In general, according to one embodiment, there is provided a semiconductor device including a transmission and reception circuit and a control circuit. The transmission and reception circuit transmits and receives a signal to and from a semiconductor memory device. The control circuit acquires threshold voltage distribution information of a memory element connected to a word line for read disturb detection to which a second voltage higher than a first voltage applied to an adjacent word line adjacent to a read target word line during a read operation is applied and determines an influence of read disturb based on the threshold voltage distribution information.

Hereinafter, at least one embodiment will be described with reference to the drawings.

First Embodiment

A memory system according to a first embodiment will be described. In the following, a memory system provided with a nonvolatile memory as a semiconductor memory device will be described as an example.

Overall Configuration of Memory System

First, a rough overall configuration of a memory system according to a first embodiment will be described with reference to FIG. 1.

Figure 1:
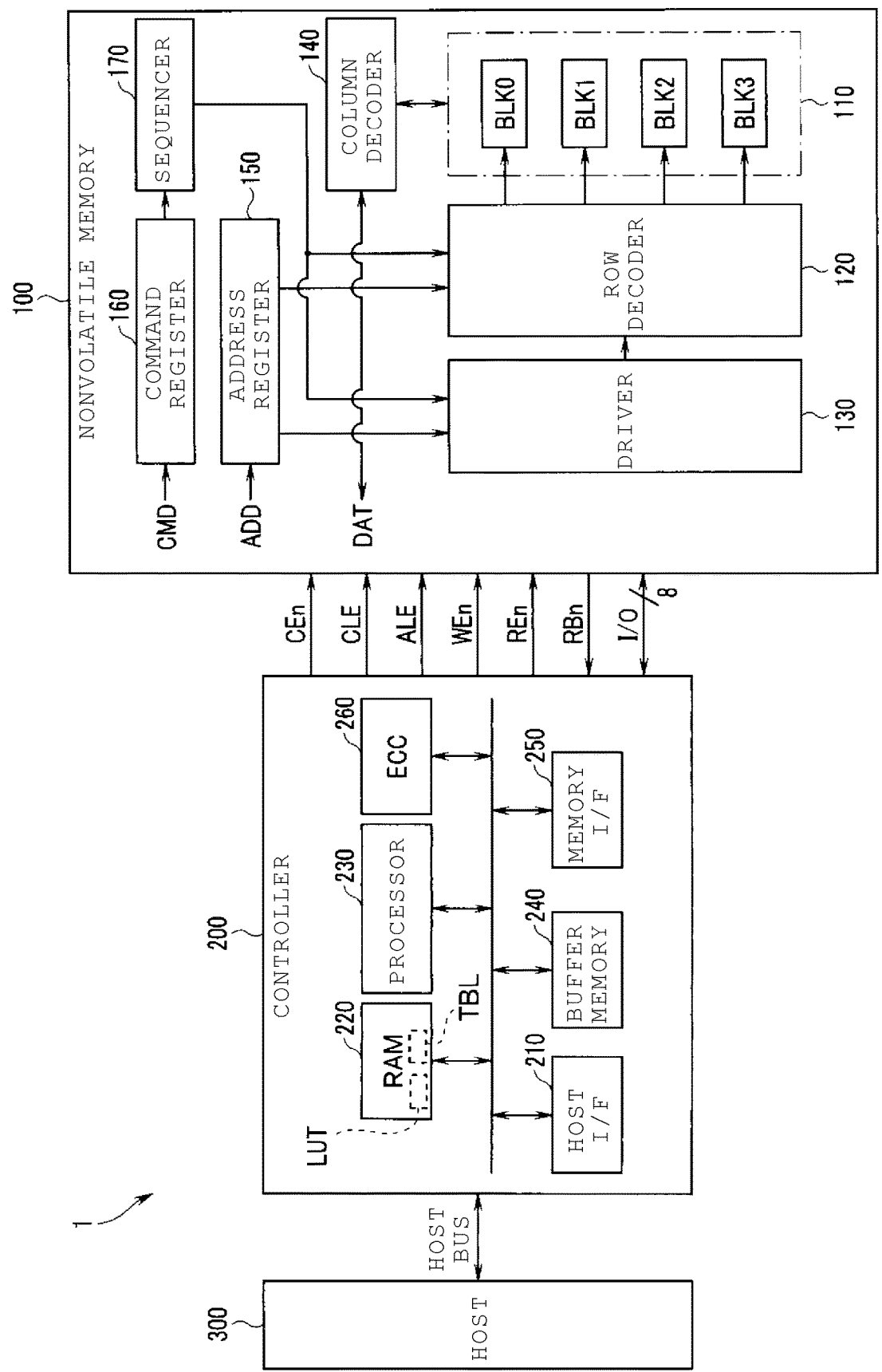
FIG. 1 is a block diagram for illustrating a configuration of a memory system according to a first embodiment.

FIG. 1 is a block diagram for illustrating the configuration of the memory system according to the first embodiment. As illustrated in FIG. 1, a memory system 1 includes a nonvolatile memory 100 and a memory controller (hereinafter, also simply referred to as a controller) 200. The nonvolatile memory 100 and the controller 200 are, for example, semiconductor devices formed on one substrate, and the semiconductor devices are used for a memory card such as an SD card, a solid state drives (SSD), or the like, for example.

The nonvolatile memory 100 is a semiconductor memory device that includes a plurality of memory cells and stores data in a nonvolatile manner, and includes, for example, a NAND flash memory. In this embodiment, the nonvolatile memory 100 will be described as a NAND memory having a memory cell capable of storing 2 bits (4 values) per memory cell, that is, a NAND memory of 2 bits/Cell (MLC: multilevel cell). It is noted that the nonvolatile memory 100 is not limited thereto. The nonvolatile memory 100 has a three-dimensional structure.

The controller 200 is connected to the nonvolatile memory 100 via a memory bus, and is connected to a host device 300 via a host bus. The controller 200 is a memory controller that controls the nonvolatile memory 100 and accesses the nonvolatile memory 100 in response to a request received from the host device 300. The host device 300 is, for example, a digital camera, a personal computer, or the like, and the host bus is, for example, a bus conforming to an SD interface. The memory bus is a bus that transmits and receives signals conforming to a memory interface.

Various signals are transmitted and received between the nonvolatile memory 100 and the controller 200 via a memory interface (I/F) circuit 250. A chip enable signal CEn, a command latch enable signal CLE, an address latch enable signal ALE, a write enable signal WEn, and a read enable signal REn are supplied from the controller 200 to the nonvolatile memory 100. A ready/busy signal RBn is supplied from the nonvolatile memory 100 to the controller 200. An input/output signal I/O is transmitted and received between the controller 200 and the nonvolatile memory 100.

The chip enable signal CEn is a signal for enabling the nonvolatile memory 100, and is asserted at a low level. The command latch enable signal CLE and the address latch enable signal ALE are signals for notifying the nonvolatile memory 100 that the input/output signals I/O are a command and an address, respectively. The write enable signal WEn is asserted at the low level and is a signal for notifying the nonvolatile memory 100 that the input/output signal I/O is written to the nonvolatile memory 100. The read enable signal REn is also asserted at the low level and is a signal for outputting read data from the nonvolatile memory 100 to the input/output signal I/O. The ready/busy signal RBn is a signal indicating whether the nonvolatile memory 100 is in a ready state (state in which an instruction from the controller 200 can be received) or a busy state (state in which an instruction from the controller 200 cannot be received), and the low level indicates the busy state. The input/output signal I/O is, for example, an 8-bit signal. The input/output signal I/O is data transmitted and received between the nonvolatile memory 100 and the controller 200, and is a command, an address, write data, read data, and the like.

Controller Configuration

Next, details of a configuration of the controller 200 will be described. As illustrated in FIG. 1, the controller 200 is a circuit that includes a host interface (I/F) circuit 210, a random access memory (hereinafter referred to as RAM) 220 which is an embedded memory, a processor 230 including a central processing unit (CPU), a buffer memory 240, a memory interface circuit 250, and an error checking and correcting (ECC) circuit 260.

The host interface circuit 210 is connected to the host device 300 via the host bus, and transfers a request and data received from the host device 300 to the processor 230 and the buffer memory 240, respectively. In response to the command of the processor 230, data in the buffer memory 240 is transferred to the host device 300.

The RAM 220 is a semiconductor memory such as a DRAM or SRAM, and is used as a work area of the processor 230. The RAM 220 stores firmware for managing the nonvolatile memory 100 and management information MI. The management information MI is a look-up table (LUT), shift table information (TBL), and the like. The shift table information TBL includes shift information. The shift information is information for shifting a data read state when the controller 200 executes a data read process. Although the RAM 220 is described as an embedded memory, the RAM 220 is not limited thereto, and may be an external memory device (external memory).

The processor 230 configuring a control circuit controls an operation of the entire controller 200. For example, when the processor 230 receives a data request from the host device 300, the processor 230 issues a read command to the memory interface circuit 250 in response to the data request. When a data write request and a data erase request from the host device 300 are received, the processor 230 similarly issues a command corresponding to the received request to the memory interface circuit 250. The processor 230 executes various processes for managing the nonvolatile memory 100, such as wear leveling.

The buffer memory 240 temporarily stores write data and read data.

The memory interface circuit 250 is connected to the nonvolatile memory 100 via a memory bus and controls communication with the nonvolatile memory 100. Then, the memory interface circuit 250 transmits various signals including commands, data, and the like to the nonvolatile memory 100 based on the command received from the processor 230, and also receives various signals and data from the nonvolatile memory 100.

The memory interface circuit 250 configuring the transmission and reception circuit outputs, based on the command received from the processor 230, the chip enable signal CEn, the command latch enable signal CLE, the address latch enable signal ALE, the write enable signal WEn, and the read enable signal REn to the nonvolatile memory 100. During writing of data, the memory interface circuit 250 transfers a write command issued by the processor 230 and the write data in the buffer memory 240 to the nonvolatile memory 100 as input/output signals I/O. Furthermore, during reading of data, the memory interface circuit 250 transfers the read command issued by the processor 230 to the nonvolatile memory 100 as the input/output signal I/O, and further receives the data read from the nonvolatile memory 100 as the input/output signal I/O, and transfers this received data to the buffer memory 240.

The ECC circuit 260 performs an error detection and error correction process on the data stored in the nonvolatile memory 100. That is, the ECC circuit 260 generates an error correction code during writing of data, adds the error correction code to the write data, and decodes the data while correcting the error during reading of data.

Configuration of Nonvolatile Memory

Next, a configuration of the nonvolatile memory 100 will be described. As illustrated in FIG. 1, the nonvolatile memory 100 includes a memory cell array 110, a row decoder 120, a driver circuit 130, a column decoder 140, an address register 150, a command register 160, and a sequencer 170.

The memory cell array 110 includes a plurality of blocks BLK including a plurality of nonvolatile memory cells correlated with rows and columns. In FIG. 1, four blocks BLK0 to BLK3 are illustrated as an example. Then, the memory cell array 110 stores the data given by the controller 200 in a nonvolatile manner.

The row decoder 120 selects any of the blocks BLK0 to BLK3 based on a block address BA in the address register 150, and further selects a word line WL in the selected block BLK.

The driver circuit 130 supplies a voltage to the selected block BLK via the row decoder 120 based on a page address PA in the address register 150.

The column decoder 140 includes a plurality of data latch circuits and a plurality of sense amplifiers. During reading of data, each sense amplifier senses the data read from the memory cell array 110 and performs a necessary operation. Then, the column decoder 140 outputs data DAT to the controller 200 via the data latch circuit. During writing of data, the column decoder 140 receives write data DAT received from the controller 200 in the data latch circuit, and then executes a write operation to the memory cell array 110.

The address register 150 stores an address ADD received from the controller 200. This address ADD includes the block address BA and page address PA described above. The command register 160 stores a command CMD received from the controller 200.

The sequencer 170 controls the operation of the entire nonvolatile memory 100 based on the command CMD stored in the command register 160, and executes, for example, a write operation, a read operation, an erasing operation, and the like.

Figure 2:
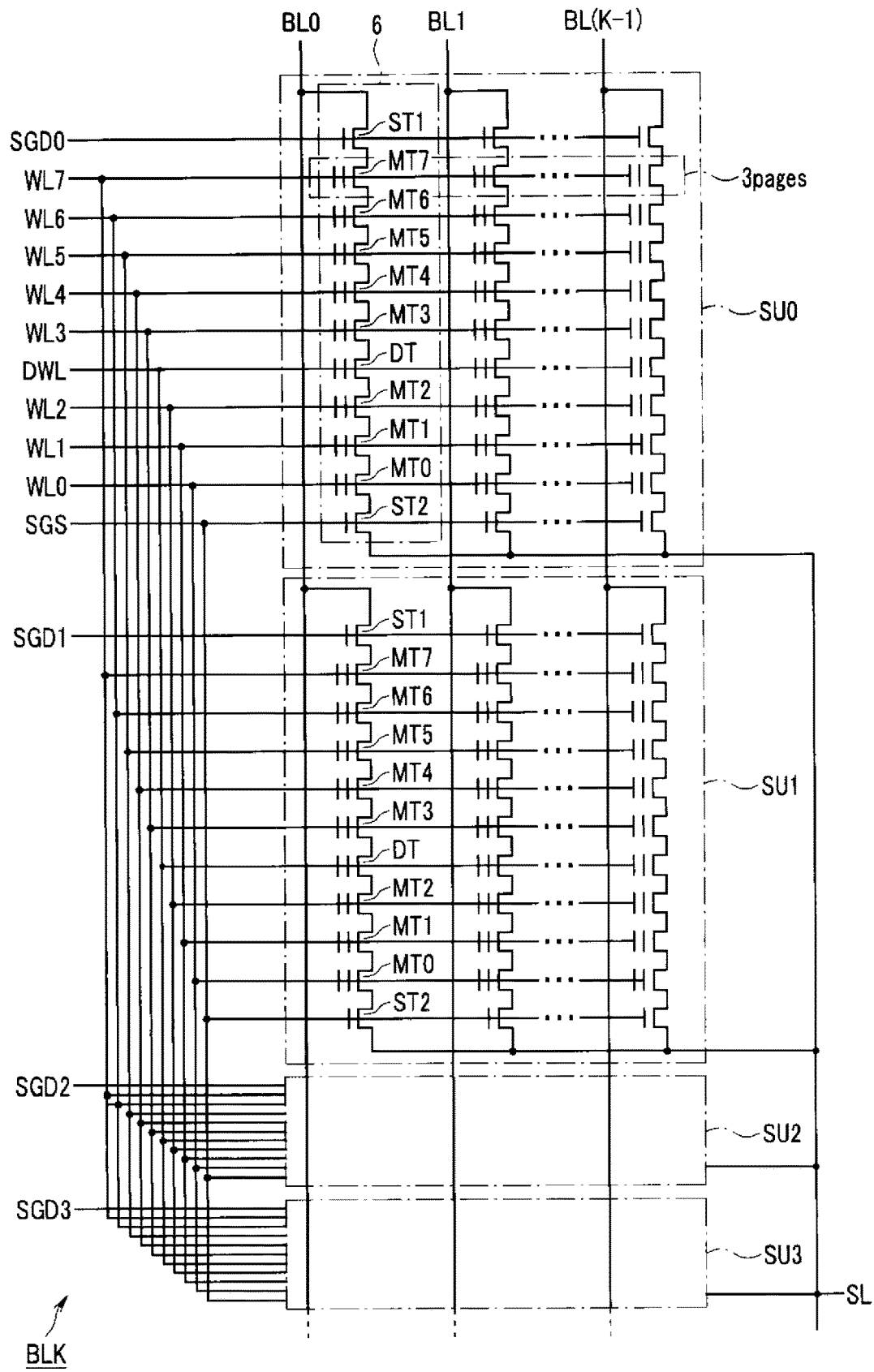
FIG. 2 is a circuit diagram for illustrating a configuration of a memory cell array according to the first embodiment.

Next, a configuration of the block BLK will be described with reference to FIG. 2. FIG. 2 is a circuit diagram for illustrating a configuration of a memory cell array according to the first embodiment. As illustrated, one block BLK includes, for example, four string units SU (SU0 to SU3). Each string unit SU also includes a plurality of NAND strings 6.

Each of the NAND strings 6 includes, for example, eight memory cell transistors MT (MT0 to MT7), one dummy cell transistor DT, and two select transistors ST1 and ST2. The number of memory cell transistors MT in the NAND string NS is eight here, but is not limited to eight, and may be, for example, 32, 48, 64, 96, or any number of memory cell transistors MT maybe used. The select transistors ST1 and ST2 are illustrated as one transistor on the electric circuit, but may be structurally the same as a memory cell transistor MT. For example, in order to improve cutoff characteristics, a plurality of select transistors may be used as the select transistors ST1 and ST2, respectively.

Each memory cell transistor MT includes a control gate and a charge storage layer, and stores data in a nonvolatile manner. The dummy cell transistor DT has the same structure as the memory cell transistor MT, but is not used for storing data transmitted from the memory controller 200 in response to a request from the host device 300. The dummy cell transistor DT is used for detecting the influence of read disturb. Any dummy data can be written to the dummy cell transistor DT when a program operation for writing data to the corresponding block BLK for the first time is executed. As will be described later, a predetermined voltage VREADK+ is applied to the dummy cell transistor DT via a dummy word line DWL during a read operation. A plurality of (for example, eight) memory cell transistors MT and dummy cell transistors DT are connected in series between a source of the select transistor ST1 and a drain of the select transistor ST2.

In the example of FIG. 2, the dummy cell transistor DT is disposed (connected in series) between memory cell transistors MT2 and MT3, but the dummy cell transistor DT is not limited thereto, and may be disposed (connected in series) between the select transistor ST2 and the memory cell transistor MT0 and between the memory cell transistor MT7 and the select transistor ST1. Alternatively, the dummy cell transistor DT may be disposed (connected in series) between any two memory cell transistors MT among the memory cell transistors MT0 to MT7.

Gates of the select transistors ST1 in the string units SU0 to SU3 are connected to select gate lines SGD0 to SGD3, respectively. In contrast, gates of the select transistors ST2 in the string units SU0 to SU3 are commonly connected to, for example, a select gate line SGS. Of course, gates of the select transistors ST2 in the string units SU0 to SU3 may be respectively connected to the select gate lines SGS0 to SGS3 each of which is different for each string unit. Control gates of the memory cell transistors MT0 to MT7 in the same block BLK are commonly connected to the word lines WL0 to WL7, respectively.

Similarly, control gates of the dummy cell transistors DT in the same block BLK are commonly connected to the dummy word lines DWL. That is, the word lines WL0 to WL7, the dummy word lines DWL, and the select gate line SGS are commonly connected between the plurality of string units SU0 to SU3 in the same block BLK, whereas the select gate line SGD is independent for each of the string unit SU0 to SU3 even in the same block BLK.

Drains of the select transistors ST1 of the plurality of NAND strings 6 in the same column in the memory cell array 110 are commonly connected to a bit line BL (BL0 to BL (K−1), where K is a natural number of 2 or more). That is, the bit line BL commonly connects the plurality of NAND strings 6 between the plurality of blocks BLK. Furthermore, sources of the plurality of select transistors ST2 are commonly connected to the source line SL.

That is, each string unit SU includes the plurality of NAND strings 6 connected to the plurality of bit lines BL different from each other and connected to the same select gate line SGD. Each block BLK includes a plurality of string units SU that share each word line WL. The memory cell array 110 is an aggregate of the plurality of blocks BLK to which respective bit lines BL are commonly connected.

Read Operation

Next, the influence of read disturb during the read operation will be described. Read disturb is a phenomenon in which a threshold voltage distribution of the memory cell transistor MT is disrupted and data changes due to a high voltage being applied to a read non-target word line WL during the read operation.

Figure 3:
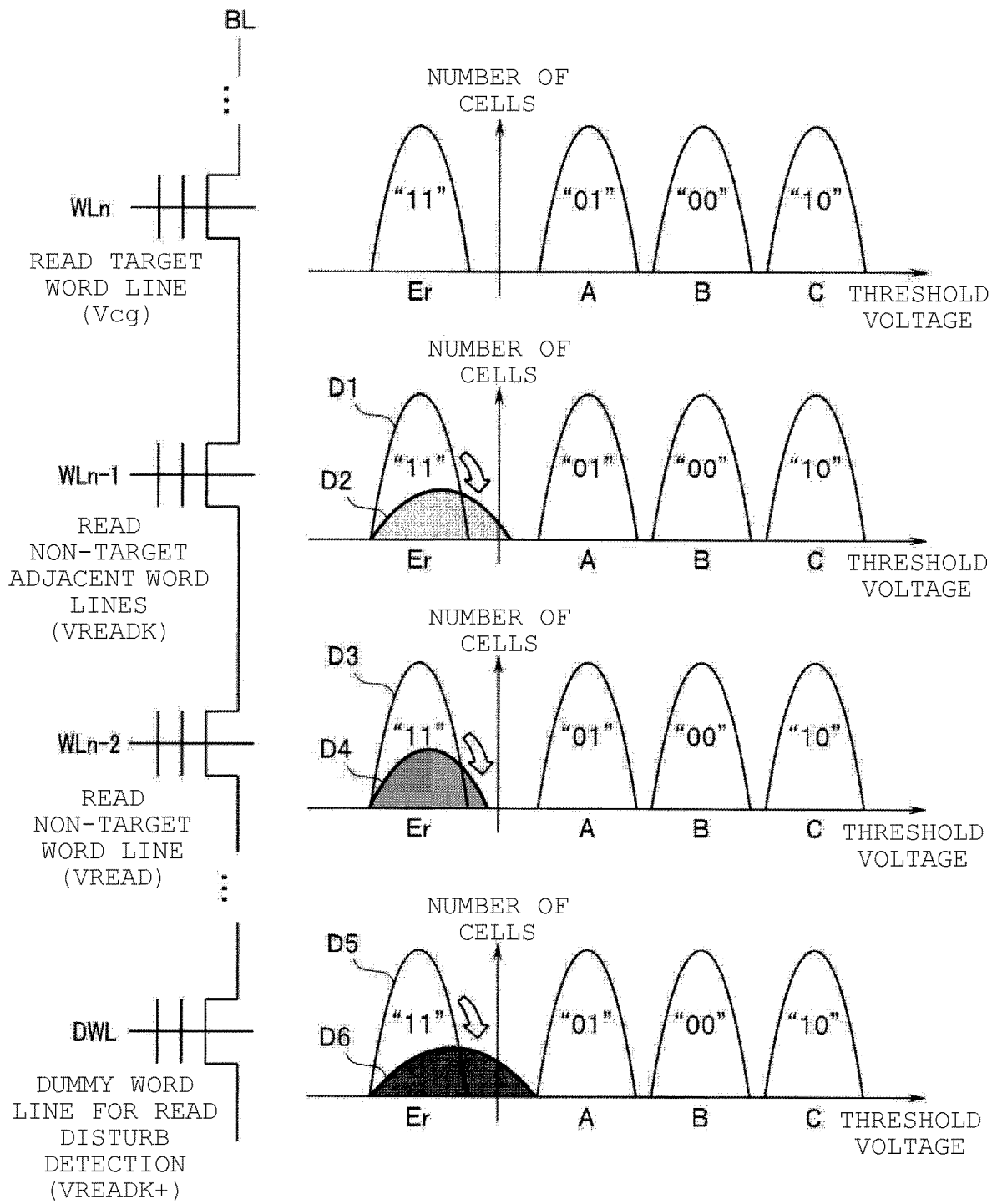
FIG. 3 is a diagram for illustrating the influence of read disturb during a read operation.

FIG. 3 is a diagram for illustrating the influence of read disturb during a read operation. In FIG. 3, among the word lines WL0 to WL7, the read target word line will be described as a word line WLn.

When the memory cell transistor MT latches (stores) 2-bit data, the memory cell transistor MT has one of four threshold voltages. The four threshold voltages are referred to as Er, A, B, and C states in ascending order. The threshold voltages of the plurality of memory cell transistors MT belonging to each of the Er, A, B and C states form a plurality of distributions. For example, "11" data, "01" data, "00" data, and "10" data are allocated to the threshold voltage distributions of Er, A, B, and C states, respectively. The allocation of the threshold voltage distribution and the data can be freely set.

Reading of data from a multi-valued memory cell transistor MT is performed by applying a read voltage Vcg to the read target word line WLn by the row decoder 120 and sensing data read to the bit line BL by the sense amplifier of the column decoder 140 to determine whether the read data is "0" or "1".

In order to electrically connect the memory cell transistor MT connected to the read non-target word line WL, the row decoder 120 applies a sufficiently high voltage VREAD required to turn on each memory cell transistor MT to the read non-target word line WL. In this case, the row decoder 120 applies a voltage VREADK slightly higher than the voltage VREAD to read non-target adjacent word lines WLn−1 and WLn+1 adjacent to the read target word line WLn among the read non-target word lines WL in order to help boost the read voltage Vcg and implement a high-speed read.

That is, the voltage VREAD is applied to word lines WLn−2, WLn+2, and the like that are not adjacent to the read target word line WLn, and the voltage VREADK slightly higher than the voltage VREAD is applied to the word lines WLn−1 and WLn+1 that are adjacent to the read target word line WLn. For that reason, the memory cell transistor MT connected to the word lines WLn−1 and WLn+1 adjacent to the read target word line WLn is most influenced by read disturb.

In this embodiment, the dummy word line DWL for read disturb detection is provided, and a voltage VREADK+, which is a second voltage slightly higher than the voltage VREADK, which is a first voltage, is applied to the dummy word line DWL. With this configuration, a voltage, which is higher than that of the memory cell transistor MT connected to the word lines WLn−1 and WLn+1 adjacent to the read target word line WLn, is applied to the dummy cell transistor DT connected to the dummy word line DWL. For that reason, the dummy cell transistor DT connected to the dummy word line DWL is more influenced by read disturb than the memory cell transistor MT connected to the word lines WLn−1 and WLn+1 adjacent to the read target word line WLn.

The controller 200 accesses the dummy word line DWL of the nonvolatile memory 100 at any time point by using a pre-command, and acquires threshold voltage distribution information of the dummy cell transistor DT configuring a memory element connected to the dummy word line DWL.

When the controller 200 accesses the dummy word line DWL and acquires the threshold voltage distribution information of the dummy cell transistor DT connected to the dummy word line DWL, the controller 200 checks the acquired threshold voltage distribution information and determines the influence of read disturb. Specifically, the controller 200 compares the number of cells whose voltage rises from an erase state (Er state) to a write state (A state) with a predetermined threshold value. When it is determined that the number of cells whose voltage is rising is less than the predetermined threshold value, the controller 200 determines that the influence of read disturb is small, and when it is determined that the number of cells whose voltage is rising is equal to or greater than the predetermined threshold value, the controller 200 determines that the influence of read disturb is large.

When it is determined that the influence of read disturb is small, the controller 200 does not perform the process, and when it is determined that the influence of read disturb is large, the controller 200 controls the nonvolatile memory 100 so as to copy data of the corresponding block BLK to a new block BLK, and initializes the influence of read disturb.

Figure 4:
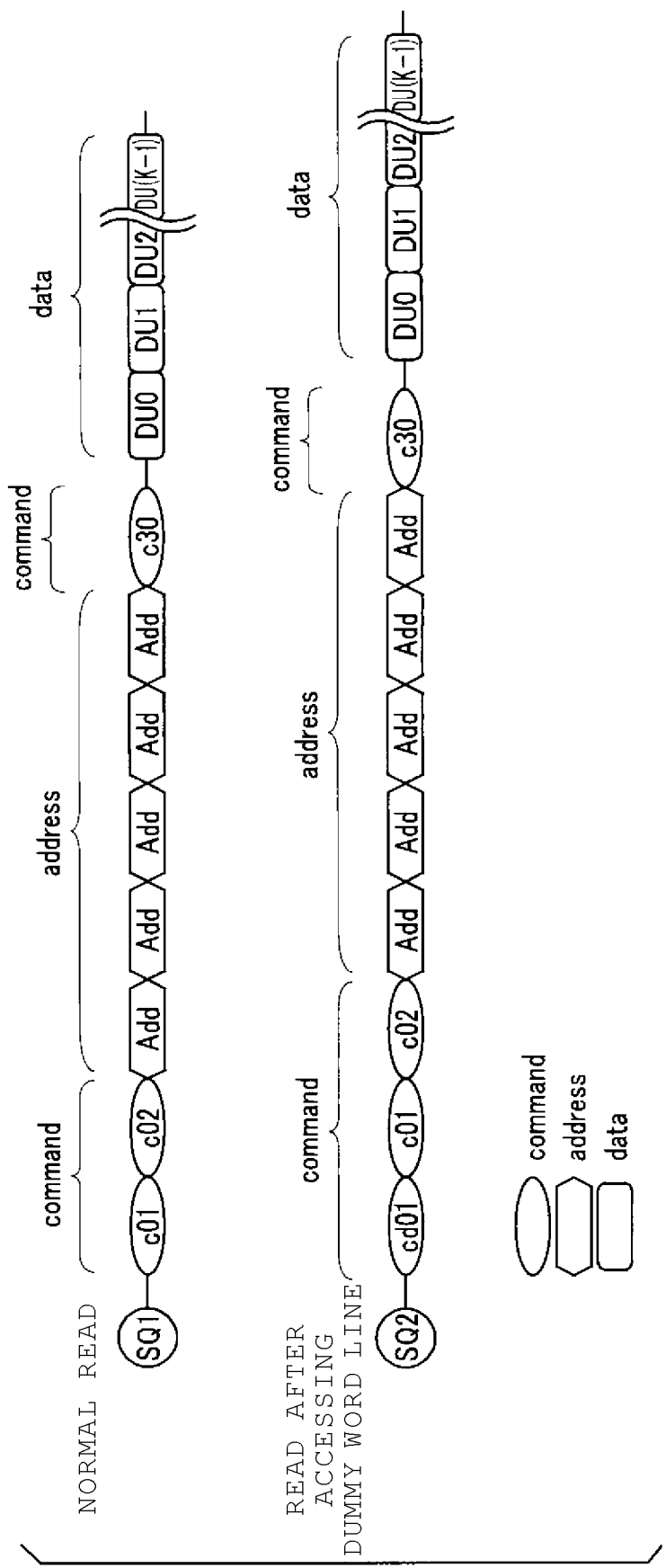
FIG. 4 is a diagram illustrating a basic command sequence during data read and a command sequence when accessing a dummy word line.

FIG. 4 is a diagram illustrating a basic command sequence during data read and a command sequence when accessing a dummy word line.

In normal reading, as illustrated in a command sequence SQl, the controller 200 outputs a command "c01" for making a read reservation to the input/output signal I/O. Following the command "c01", the controller 200 outputs a command "c02" to the input/output signal I/O. Following the command "c02", the controller 200 outputs addresses, that takes five cycles, including a column address and a row address to the input/output signal I/O.

Following the five addresses, the controller 200 outputs a command "c30" to the input/output signal I/O. The command "c30" is a command instructing execution of reading data. Therefore, the sequencer 170 executes reading of data from a designated address.

The read data is sensed by each sense amplifier of the column decoder 140 and stored in each data latch circuit. Then, the column decoder 140 outputs the data DAT stored in the data latch circuit to the controller 200.

On the other hand, when accessing the dummy word line DWL, as illustrated in a command sequence SQ2, the controller 200 outputs a pre-command "cd01" to the input/ output signal I/O before the command "c01". The command and address after the pre-command "cd01" are the same as those of the command sequence SQl in normal reading.

The pre-command "cd01" is a command for accessing the dummy word line DWL and acquiring the threshold voltage distribution information of the dummy cell transistor DT connected to the dummy word line DWL. Therefore, the sequencer 170 acquires the threshold voltage distribution information of the dummy cell transistor DT connected to the dummy word line DWL and outputs the threshold voltage distribution information to the controller 200.

Figure 5:
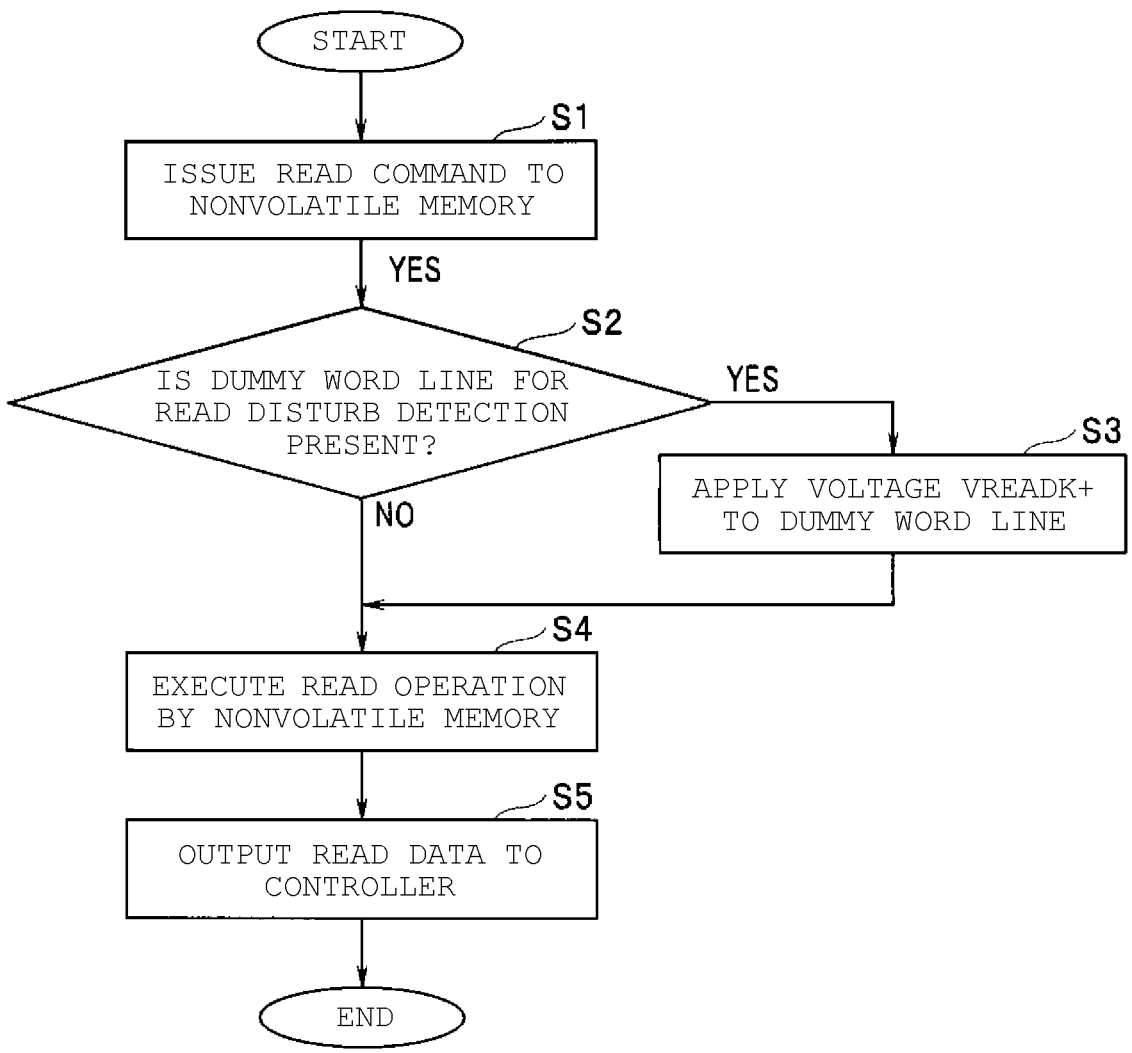
FIG. 5 is a flowchart illustrating an example of the read operation according to the first embodiment.

FIG. 5 is a flowchart illustrating an example of the read operation according to the first embodiment. The controller 200 issues a read command to the nonvolatile memory 100 (S1). When the read command is received, the sequencer 170 of the nonvolatile memory 100 determines whether or not a dummy word line DWL for read disturb detection is present (S2). When it is determined that the dummy word line DWL for read disturb detection is present, the sequencer 170 applies the voltage VREADK+ to the dummy word line DWL (S3).

On the other hand, when the sequencer 170 determines, in the process of S2, that the dummy word line DWL for read disturb detection is not present, or when the voltage VREADK+ is applied to the dummy word line DWL in the process of S3, the nonvolatile memory 100 executes the read operation (S4). Finally, the nonvolatile memory 100 outputs the read data DAT to the controller 200 (S5), and ends the read operation.

Figure 6:
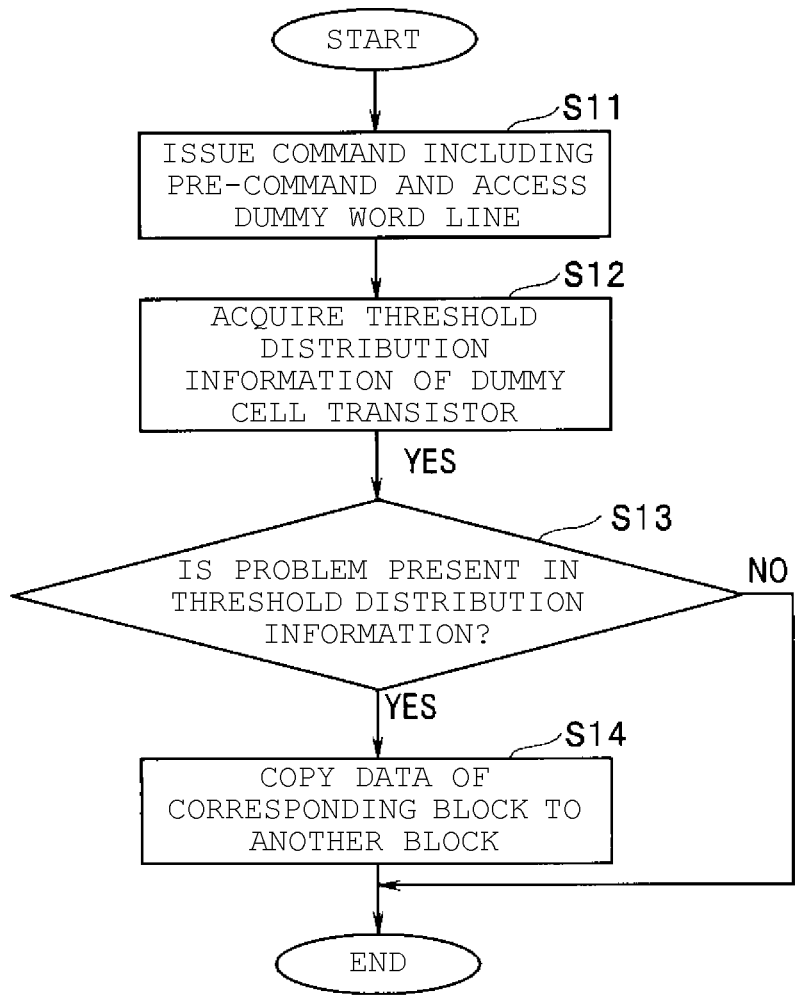
FIG. 6 is a flowchart illustrating an example of a read disturb detection process according to the first embodiment.

FIG. 6 is a flowchart illustrating an example of a read disturb detection process according to the first embodiment. The timing of executing the read disturb detection process may be freely selected. For example, in the same block BLK, the read disturb detection process may be executed every time the read operation is performed, may be executed every time the read operation is performed a predetermined number of times, or may be executed every time a predetermined time elapses.

The controller 200 issues a command including a pre-command to the nonvolatile memory 100 to access the dummy word line DWL (S11). With this configuration, the controller 200 acquires the threshold voltage distribution information of the dummy cell transistor DT connected to the dummy word line DWL (S12). Next, the controller 200 determines whether or not a problem is present in the threshold voltage distribution information of the dummy cell transistor DT connected to the dummy word line DWL (S13).

When the controller 200 determines that a problem is present in the threshold voltage distribution information of the dummy cell transistor DT connected to the dummy word line DWL, the controller 200 copies data of the corresponding block BLK to another block BLK (S14), and ends the process. On the other hand, when the controller 200 determines that the problem is not present in the threshold voltage distribution information of the dummy cell transistor DT connected to the dummy word line DWL, the controller 200 ends the process as it is.

As described above, in the non-volatile memory 100, in order to detect the influence of read disturb at an early stage, the dummy word line DWL and the dummy cell transistor DT are newly provided and the voltage VREADK+ slightly higher than the voltage VREADK applied to the word lines WLn−1 and WLn+1 adjacent to the read target word line WLn when performing the read operation is applied to the dummy word line DWL. With this configuration, in the corresponding block, the newly provided dummy cell transistor DT connected to the dummy word line DWL is most influenced by read disturb.

The controller 200 can access the dummy word line DWL of the nonvolatile memory 100 at any time point and acquire the threshold voltage distribution information of the dummy cell transistor DT to detect the influence of read disturb at an early stage. Therefore, with the controller 200 of this embodiment, the influence of read disturb can be detected at an early stage.

In general, the word line WL most influenced by read disturb cannot be uniquely determined because it changes depending on a reading status such as the same word line WL in the block BLK being read many times, or the word line WL in the block BLK being read sequentially. For that reason, when checking the influence of read disturb, it is required to check the threshold voltage distribution information of the memory cell transistors MT connected to all the word lines WL in the block BLK.

In contrast, in this embodiment, since the dummy cell transistor DT connected to the dummy word line DWL is most influenced by read disturb in the block BLK, the word line WL to be accessed can be uniquely determined as the dummy word line DWL when checking the influence of read disturb.

Second Embodiment

Figure 7:
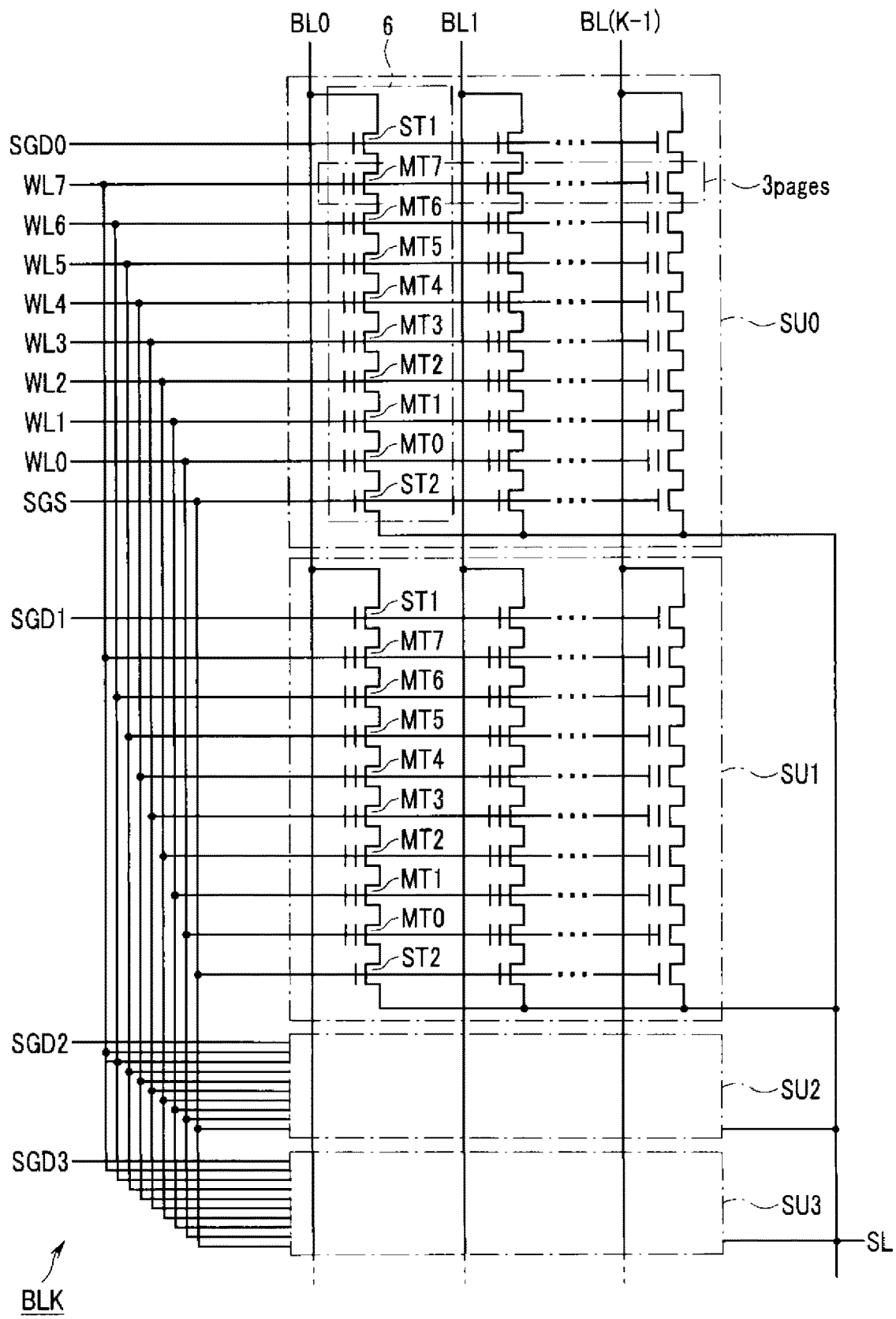
FIG. 7 is a circuit diagram for illustrating a configuration of a memory cell array according to a second embodiment.

FIG. 7 is a circuit diagram for illustrating a configuration of a memory cell array according to a second embodiment. In FIG. 7, the same configurations as those in FIG. 2 are designated by the same reference numerals and the description thereof will be omitted.

As illustrated in FIG. 7, the block BLK of the second embodiment is configured by removing the dummy word line DWL and the dummy cell transistor DT connected to the dummy word line DWL from the block BLK illustrated in FIG. 2. Then, in at least one embodiment, any word line WL among the word lines WL0 to WL7 can be set for read disturb detection. This setting is performed by the controller 200 that controls the nonvolatile memory 100 and software executed by the controller 200. With this configuration, in at least one embodiment, any set word line WL among the existing word lines WL0 to WL7 can be used for detecting the influence of read disturb without newly providing the dummy word line DWL. Other configurations are the same as those in the first embodiment.

When the controller 200 that controls the nonvolatile memory 100 and software executed by the controller 200 sets, for example, the word line WL2 for read disturb detection, the controller 200 controls so that a normal data write operation and read operation are not performed on the word line WL2. Then, during the read operation, the voltage VREADK+ slightly higher than the voltage VREADK applied to the word lines WLn−1 and WLn+1 adjacent to the read target word line WLn is applied to the word line WL2.

In at least one embodiment, in the controller 200 that controls the nonvolatile memory 100 and software executed by the controller 200, any word line WL among the word lines WL0 to WL7 is set for read disturb detection. When the word line WL for read disturb detection is set, the controller 200 controls to apply the voltage VREADK+ to the word line WL for read disturb detection by using the pre-command during the read operation.

The controller 200 accesses the word line WL set for read disturb detection of the nonvolatile memory 100 by using the pre-command and checks the threshold voltage distribution information of the memory cell transistor MT configuring the memory element connected to the word line WL at any time point, thereby detecting the influence of read disturb at an early stage. When the controller 200 determines that a problem is present in the threshold voltage distribution information of the memory cell transistor MT connected to the word line WL set for read disturb detection, the controller 200 copies data of the corresponding block BLK to another block BLK and initializes the influence of read disturb.

Figure 8:
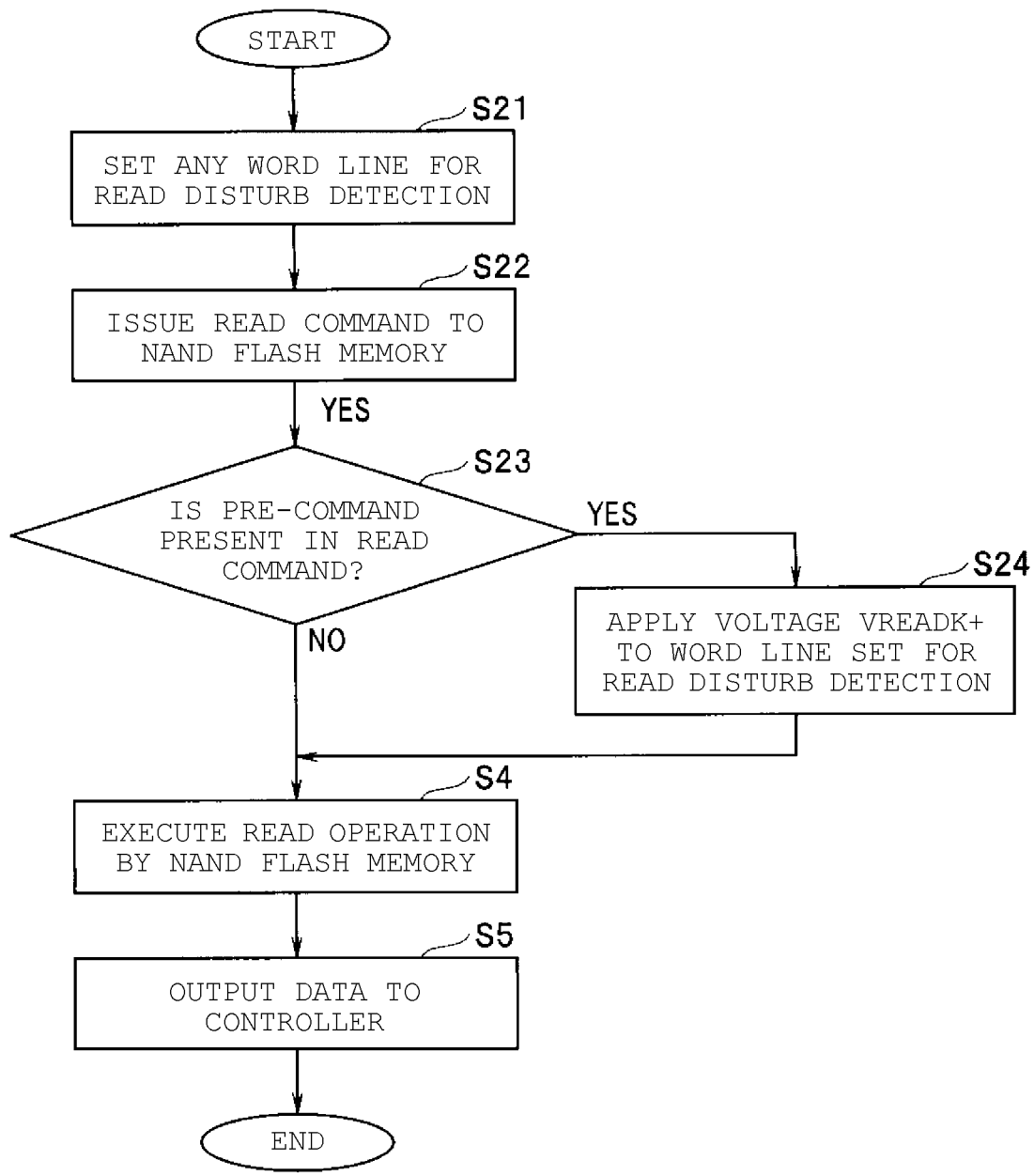
FIG. 8 is a flowchart illustrating an example of a read operation of the second embodiment.

FIG. 8 is a flowchart illustrating an example of a read operation of the second embodiment. In FIG. 8, the same processes as in FIG. 5 are designated by the same reference numerals and the description thereof will be omitted.

The controller 200 sets any word line WL among the word lines WL0 to WL7 for read disturb detection (S21). The controller 200 issues a read command to the nonvolatile memory 100 (S22). When the read command is received, the sequencer 170 of the nonvolatile memory 100 determines whether or not the read command includes a pre-command (S23). When the sequencer 170 determines that the read command includes the pre-command, the sequencer 170 applies the voltage VREADK+ to the word line WL set for read disturb detection (S24).

On the other hand, when the sequencer 170, in the process of S23, determines that the read command does not include the pre-command, or when the voltage VREADK+ is applied to the word line WL set for read disturb detection in the process of S24, the nonvolatile memory 100 executes a read operation in the process of S4. Thereafter, in the process of S5, the data DAT read by the nonvolatile memory 100 is output to the controller 200, and the read operation is ended.

Figure 9:
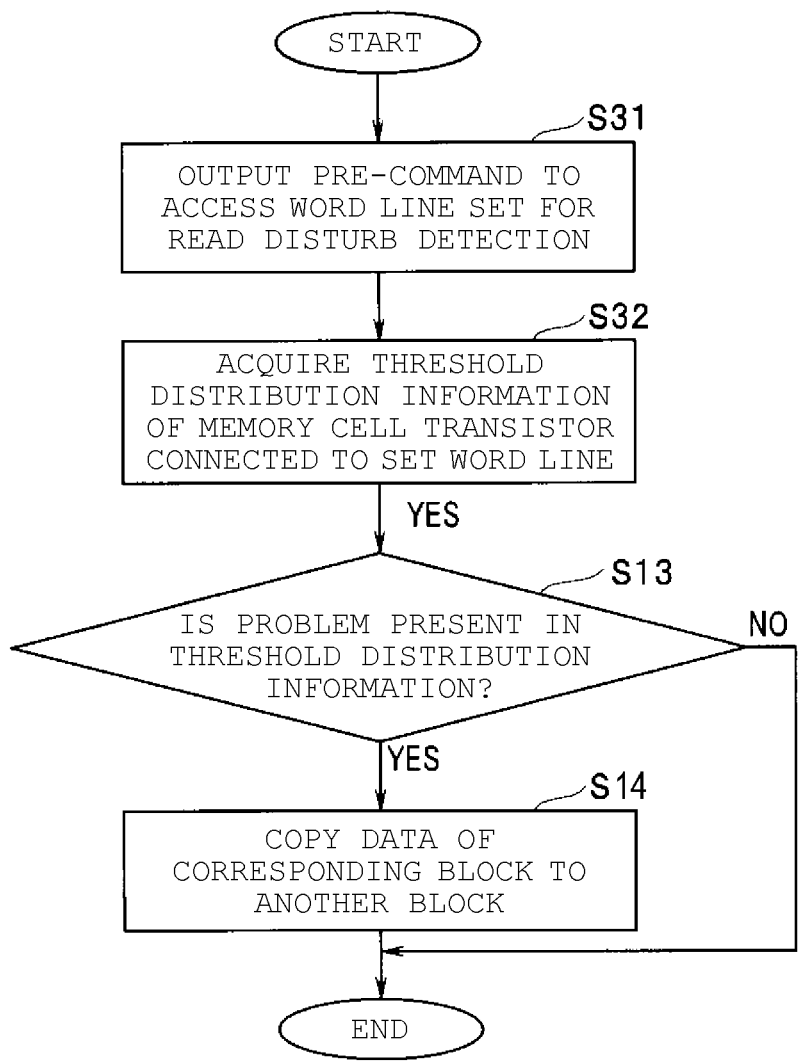
FIG. 9 is a flowchart illustrating an example of a read disturb detection process of the second embodiment.

FIG. 9 is a flowchart illustrating an example of a read disturb detection process of the second embodiment. The timing of executing the read disturb detection process may be freely selected. In FIG. 9, the same processes as those in FIG. 6 are designated by the same reference numerals and the description thereof will be omitted.

The controller 200 outputs the pre-command to access the word line WL set for read disturb detection (S31). With this configuration, the controller 200 acquires the threshold voltage distribution information of the memory cell transistor MT connected to the word line WL set for read disturb detection (S32).

When the controller 200 determines, in the process of S13, that a problem is not present in the threshold voltage distribution information, the controller 200 ends the process as it is. On the other hand, when the controller 200 determines, in the process of S14, that the problem is present in the threshold voltage distribution information, the controller 200 copies data of the corresponding block BLK to another block BLK in the process of S13, and ends the process.

As described above, in the controller 200 and software executed by the controller 200, any word line WL among the word lines WL0 to WL7 is set for read disturb detection. Then, the controller 200 accesses the word line WL determined for read disturb detection by using the pre-command. As a result, the controller 200 of at least one embodiment can detect the influence of read disturb at an early stage even when the nonvolatile memory 100 does not include the dummy word line DWL for read disturb detection.

Third Embodiment

Figure 10:
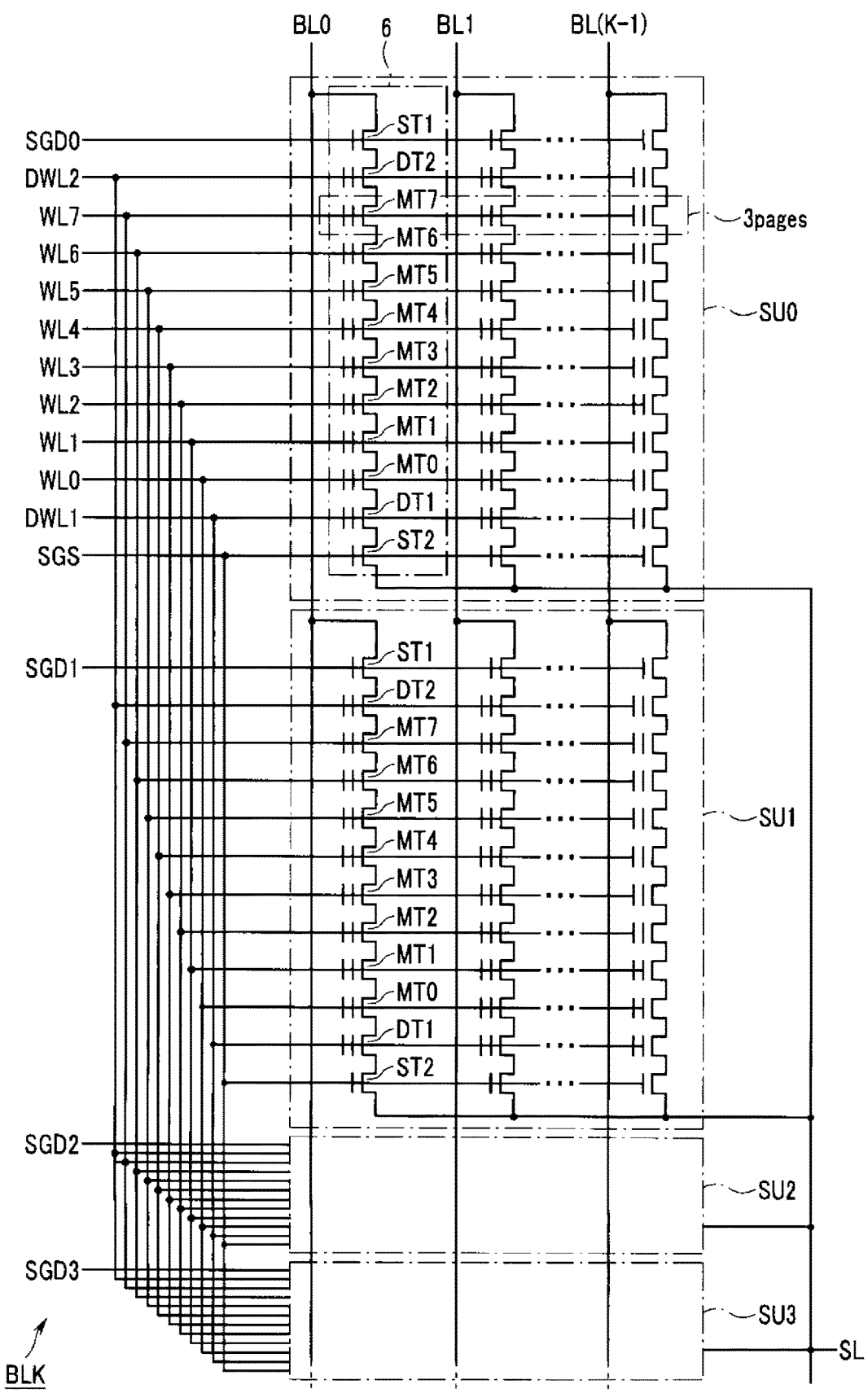
FIG. 10 is a circuit diagram for illustrating a configuration of a memory cell array according to a third embodiment.

FIG. 10 is a circuit diagram for illustrating a configuration of a memory cell array according to a third embodiment. In FIG. 10, the same configurations as those in FIG. 7 are designated by the same reference numerals and the description thereof will be omitted.

Normally, in each of the NAND strings 6, an existing dummy cell transistor is provided between the select transistor ST2 and the memory cell transistor MT0, and an existing dummy cell transistor is provided between the select transistor ST1 and the memory cell transistor MT7. The existing dummy cell transistor is not for storing data, but has a function of relaxing disturb received by the memory cell transistor and the select transistor during the write operation and the erasing operation.

As illustrated in FIG. 10, each of the NAND strings 6 is configured by connecting an existing dummy cell transistor DT1 in series between the select transistor ST2 and the memory cell transistor MT0. Each of the NAND strings 6 is configured by connecting an existing dummy cell transistor DT2 in series between the select transistor ST1 and the memory cell transistor MT7.

Control gates of the dummy cell transistors DT1 in the same block BLK are commonly connected to a dummy word line DWL1. Similarly, control gates of the dummy cell transistor DT2 in the same block BLK are commonly connected to a dummy word line DWL2.

In at least one embodiment, although one dummy cell transistor DT1 is connected in series between the select transistor ST2 and the memory cell transistor MT0, two or more dummy cell transistors may be connected in series between the select transistor ST2 and the memory cell transistor MT0. Similarly, although one dummy cell transistor DT2 is connected in series between the select transistor ST1 and the memory cell transistor MT7, two or more dummy cell transistors may be connected in series between the select transistor ST1 and the memory cell transistor MT7.

The controller 200 sets any one of the existing dummy word lines DWL1 and DWL2 as the word line for read disturb detection. The sequencer 170 can access the existing dummy word line DWL1 or DWL2 set as the word line for read disturb detection, based on a command from the controller 200. That is, during the read operation, the sequencer 170 applies the voltage VREADK+ to the existing dummy word lines DWL1 or DWL2, based on the command from the controller 200. Other configurations and operations are the same as those in the first or second embodiment.

The controller 200 can detect the influence of read disturb at an early stage by acquiring the threshold voltage distribution information of the existing dummy cell transistors DT1 or DT2 connected to the existing dummy word line DWL1 or DWL2.

As described above, the controller 200 sets the existing dummy word line DWL1 or DWL2 as the word line for read disturb detection, and detects the influence of read disturb based on the threshold voltage distribution information of the existing dummy cell transistor DT1 or DT2 connected to the existing dummy word line DWL1 or DWL2. As a result, the controller 200 of this embodiment can detect the influence of read disturb at an early stage without newly providing the dummy word line DWL for read disturb detection in the nonvolatile memory 100.

Fourth Embodiment

A hardware configuration of a fourth embodiment is the same as that of the first embodiment. In at least one embodiment, the voltage VREADK+ slightly higher than the voltage VREADK is applied to the dummy word line DWL a plurality of times during the read operation. The hardware configuration of at least one embodiment may be the same as that of the second embodiment. That is, in this embodiment, the dummy word line DWL is not provided, the voltage VREADK+ slightly higher than the voltage VREADK may be applied, a plurality of times, to any word line WL set for read disturb detection among the word lines WL0 to WL7.

Figure 11:
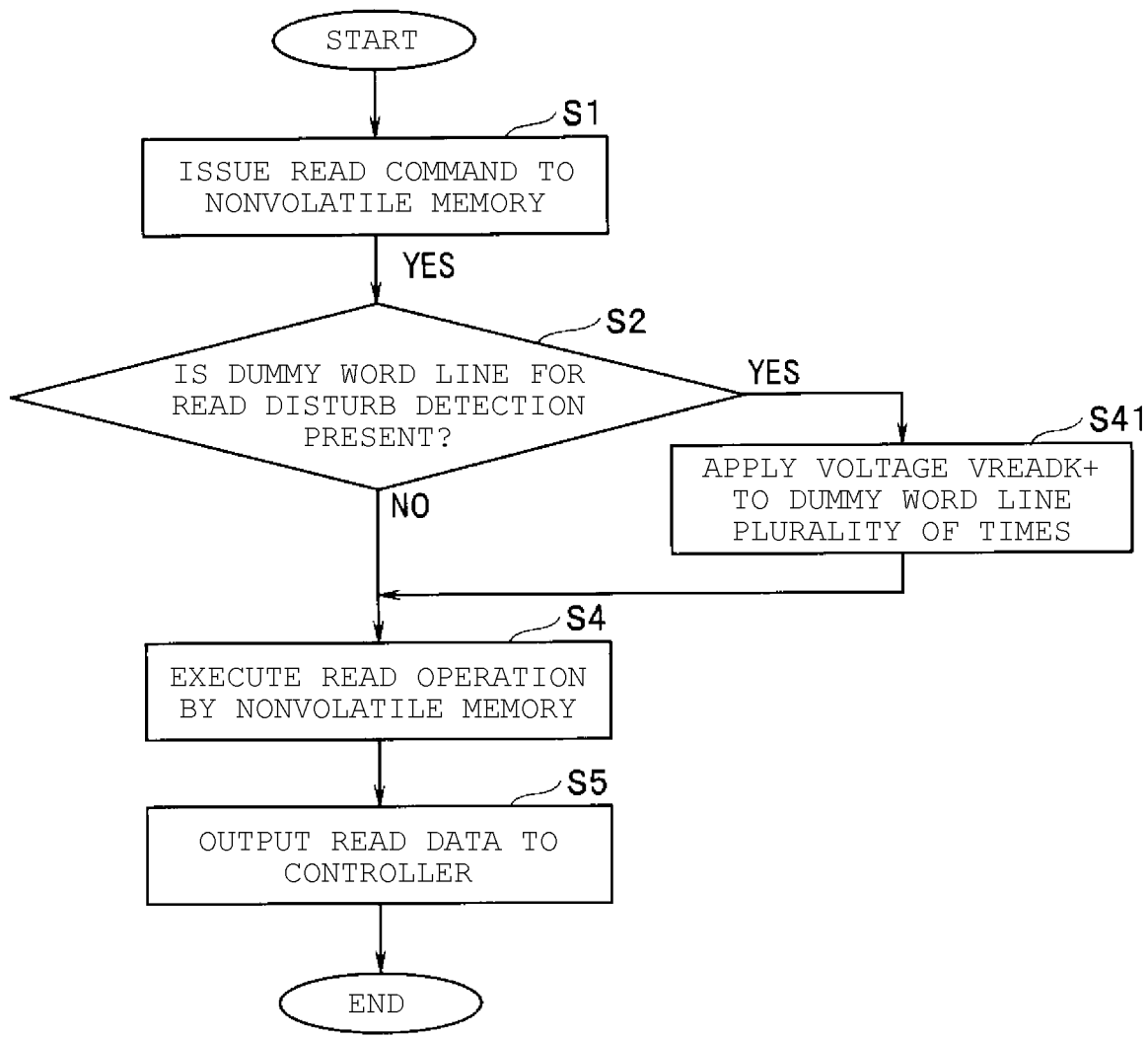
FIG. 11 is a flowchart illustrating an example of a read operation according to a fourth embodiment.

FIG. 11 is a flowchart illustrating an example of a read operation according to the fourth embodiment. In FIG. 11, the same processes as those in FIG. 5 are designated by the same reference numerals and the description thereof will be omitted.

When it is determined, in the process of S2, that a dummy word line DWL for read disturb detection is present, the sequencer 170 applies the voltage VREADK+ to the dummy word line DWL a plurality of times (S41), and proceeds to the process of S3. Other processes are the same as those in FIG. 5.

With the processes as described above, the influence of read disturb of the dummy word line DWL becomes larger than the influence of read disturb of the other word lines WL by intentionally applying the voltage VREADK+ higher than the voltage VREADK to the dummy word line DWL a plurality of times. With this configuration, the influence of read disturb of the corresponding block BLK can be detected at an early stage by checking the threshold voltage distribution information of the dummy cell transistor DT connected to the dummy word line DWL.

In at least one embodiment, the voltage VREADK+ is applied to the dummy word line DWL a plurality of times to make the influence of read disturb of the dummy word line DWL larger than the influence of read disturb of other word lines WL, but is not limited thereto. For example, when executing the read operation based on the command from the controller 200, the sequencer 170 may control the second time, during which the voltage VREADK+ is applied to the dummy word line DWL for read disturb detection, to be longer than the first time, during which the voltage VREADK, which is the first voltage, is applied to the adjacent word lines WLn−1 and WLn+1.

Fifth Embodiment

Figure 12:
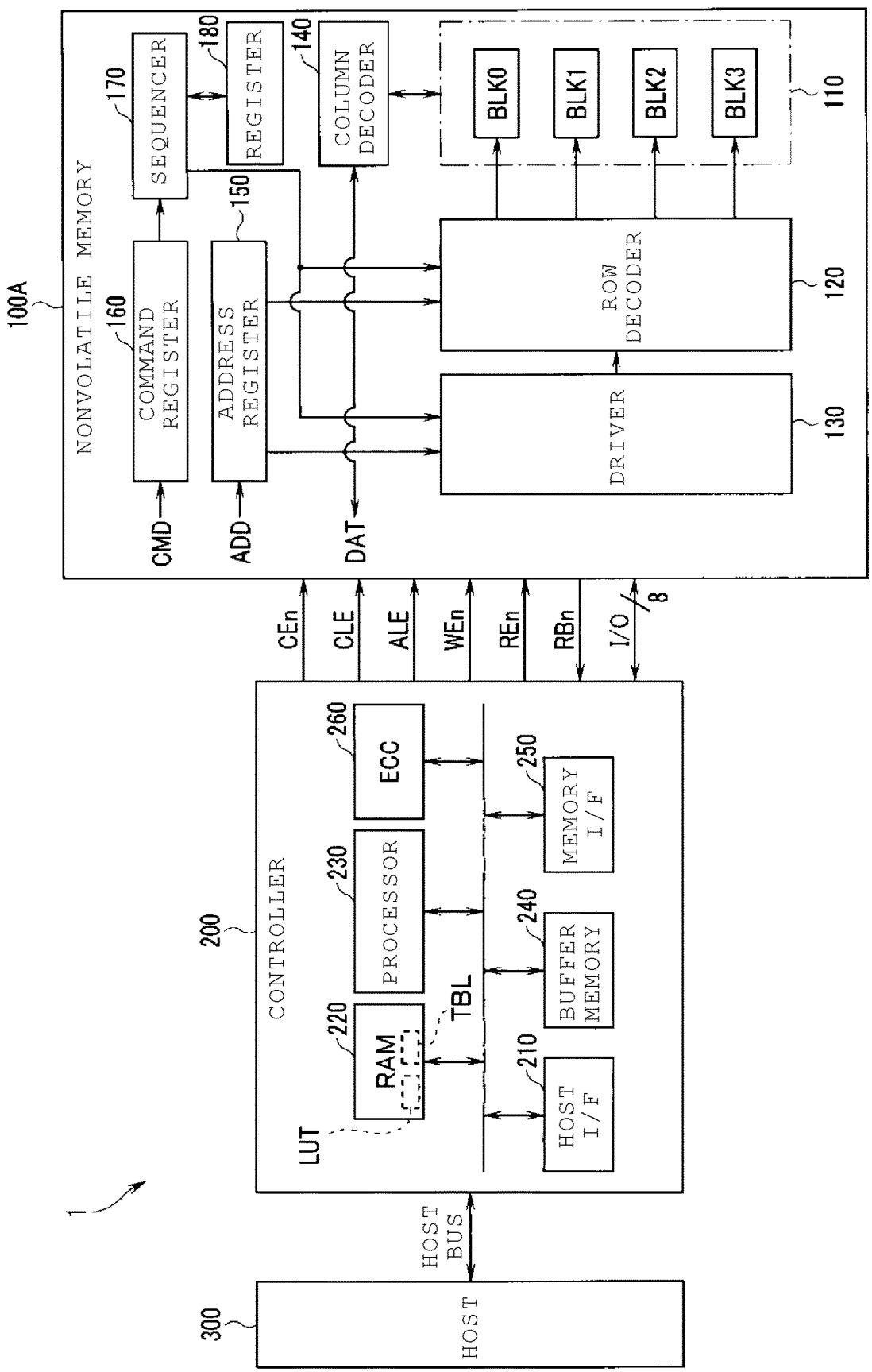
FIG. 12 is a block diagram for illustrating a configuration of a memory system according to a fifth embodiment.

FIG. 12 is a block diagram for illustrating a configuration of a memory system according to a fifth embodiment. The configuration of the memory cell array 110 is the same as the configuration of FIG. 2 including the dummy word line DWL. The configuration of the memory cell array 110 is not limited to the configuration of FIG. 2, and may be the configuration of FIG. 7. That is, at least one embodiment can be applied even in a configuration in which the dummy word line DWL is not provided and any word line WL among the word lines WL0 to WL7 is set for read disturb detection.

As illustrated in FIG. 12, the memory system includes a nonvolatile memory 100A instead of the nonvolatile memory 100. The nonvolatile memory 100A is configured by adding a register 180 to the nonvolatile memory 100.

The sequencer 170 accesses the dummy word line DWL at any time point and acquires the threshold voltage distribution information of the dummy cell transistor DT connected to the dummy word line DWL. Then, the sequencer 170 determines whether or not a problem is present in the threshold voltage distribution information, and stores the determination result as a flag in the register 180. For example, when it is determined that a problem is present in the threshold voltage distribution information, the sequencer 170 stores "1" as a flag in the register 180, and when it is determined that the problem is not present in the threshold voltage distribution information, the sequencer 170 stores "0" as the flag in the register 180.

The controller 200 acquires flag information stored in the register 180 by the pre-command during the read operation, and when it is determined that a problem is present in the threshold voltage distribution information, the controller 200 copies data of the corresponding block BLK to another block BLK and initialize the influence of read disturb.

As described above, the nonvolatile memory 100A detects the influence of read disturb, and stores the detection result as the flag in the register 180. The controller 200 can easily determine whether or not to initialize the influence of read disturb by checking the flag of the register 180 without accessing the dummy word line DWL and determining the threshold voltage distribution information of the dummy cell transistor DT.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a transmission and reception circuit configured to communicate with a semiconductor memory device; and
a control circuit configured to acquire threshold voltage distribution information of a memory element connected to a word line for read disturb detection to which a second voltage is applied and to determine an influence of read disturb based on the threshold voltage distribution information, wherein the second voltage being higher than a first voltage applied to an adjacent word line adjacent to a read target word line during a read operation,
wherein the control circuit is configured to control such that a second time during which the second voltage is applied to the word line for read disturb detection is longer than a first time during which the first voltage is applied to the adjacent word line during the read operation.

2. The semiconductor device according to claim 1, wherein the control circuit is configured to set any word line among a plurality of word lines in the semiconductor memory device as the word line for read disturb detection.

3. The semiconductor device according to claim 1, wherein the control circuit is configured to set an existing dummy word line in the semiconductor memory device as the word line for read disturb detection.

4. The semiconductor device according to claim 1, wherein the control circuit is configured to control to apply the second voltage to the word line for read disturb detection a plurality of times during the read operation.

5. A memory system comprising:
a semiconductor memory device including a word line for read disturb detection; and
a semiconductor device including a transmission and reception circuit configured to communicate with the semiconductor memory device, and a control circuit configured to acquire threshold voltage distribution information of a memory element connected to the word line for read disturb detection to which a second voltage is applied and to determine an influence of read disturb based on the threshold voltage distribution information, the second voltage being higher than a first voltage applied to an adjacent word line adjacent to a read target word line during a read operation,
wherein the control circuit is configured to control such that a second time during which the second voltage is applied to the word line for read disturb detection is longer than a first time during which the first voltage is applied to the adjacent word line during the read operation.

6. The memory system according to claim 5, wherein the control circuit is configured to set any word line among a plurality of word lines in the semiconductor memory device as the word line for read disturb detection.

7. The memory system according to claim 5, wherein the control circuit is configured to set an existing dummy word line in the semiconductor memory device as the word line for read disturb detection.

8. The memory system according to claim 5, wherein the control circuit is configured to control to apply the second voltage to the word line for read disturb detection of a plurality of times during the read operation.

9. A semiconductor memory device comprising:
a word line for read disturb detection;
a row decoder configured to apply a second voltage to the word line for read disturb detection, the second voltage being higher than a first voltage applied to an adjacent word line adjacent to a read target word line during a read operation; and
a sequencer of a controller configured to acquire threshold voltage distribution information of a memory element connected to the word line for read disturb detection to which the second voltage is applied and to determine an influence of read disturb based on the threshold voltage distribution information,
wherein the control circuit is configured to control such that a second time during which the second voltage is applied to the word line for read disturb detection is longer than a first time during which the first voltage is applied to the adjacent word line during the read operation.

10. The semiconductor memory device according to claim 9, wherein
the memory element is a memory cell transistor or a dummy cell transistor, and
the word line for read disturb detection is a dummy word line connected to the dummy cell transistor disposed between a select transistor and the memory cell transistor or between any two of a plurality of memory cell transistors including the memory cell transistor.

11. The semiconductor memory device according to claim 9, further comprising:
a register that stores a determination result of determining the influence of read disturb.

12. The semiconductor memory device according to claim 9, wherein the semiconductor memory device is a NAND memory device.

13. The memory system according to claim 5, wherein the control circuit is configured to, when the control circuit determines that an error exists in the threshold voltage distribution information, copy data of a corresponding data block to another data block.

14. The semiconductor device according to claim 1, wherein the control circuit is configured to send a pre-command to acquire a threshold voltage distribution information of a memory cell transistor connected to a dummy word line for read disturb detection.

15. The memory system according to claim 5, wherein the control circuit is configured to send a pre-command to acquire a threshold voltage distribution information of a memory cell transistor connected to a dummy word line for read disturb detection.

16. The semiconductor memory device according to claim 11, wherein the control circuit is configured to send a pre-command to acquire a threshold voltage distribution information of a memory cell transistor connected to a dummy word line for read disturb detection.

* * * * *